United States Patent
Fan et al.

(10) Patent No.: US 7,535,709 B2
(45) Date of Patent: May 19, 2009

(54) AIRFLOW-GUIDING DEVICE

(75) Inventors: Gong-Jin Fan, Shenzhen (CN); Lin Xiao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Chung, Taipei Hsien (TW)

( * ) Notice: Subject to any disclaimer, the term of this patent is extended or adjusted under 35 U.S.C. 154(b) by 32 days.

(21) Appl. No.: 11/746,649

(22) Filed: May 10, 2007

(65) Prior Publication Data

US 2008/0151490 A1 Jun. 26, 2008

(30) Foreign Application Priority Data

Dec. 22, 2006 (CN) .................... 2006 2 0016704 U

(51) Int. Cl.
*H05K 7/20* (2006.01)

(52) U.S. Cl. .................. 361/695; 361/690; 174/16.1; 174/16.3; 165/104.33

(58) Field of Classification Search .............. None
See application file for complete search history.

(56) References Cited

U.S. PATENT DOCUMENTS

| | | | | | |
|---|---|---|---|---|---|
| 5,412,534 | A | * | 5/1995 | Cutts et al. ................. | 361/695 |
| 5,793,610 | A | * | 8/1998 | Schmitt et al. ............. | 361/695 |
| 6,005,770 | A | * | 12/1999 | Schmitt ...................... | 361/695 |
| 6,031,717 | A | * | 2/2000 | Baddour et al. ............ | 361/687 |
| 6,115,250 | A | * | 9/2000 | Schmitt ...................... | 361/695 |
| 6,181,557 | B1 | * | 1/2001 | Gatti .......................... | 361/695 |
| 6,504,715 | B2 | * | 1/2003 | Ota et al. .................... | 361/695 |
| 6,808,411 | B2 | | 10/2004 | Chen | |
| 6,991,533 | B2 | * | 1/2006 | Tsai et al. ................... | 454/184 |
| 7,236,361 | B2 | * | 6/2007 | Cote et al. ................... | 361/695 |

* cited by examiner

*Primary Examiner*—Boris L Chervinsky
(74) *Attorney, Agent, or Firm*—Frank R. Niranjan

(57) ABSTRACT

An airflow-guiding device (40) is secured at one side of a row of fans (20) in a computer chassis (10) and is capable of allowing air to flow therethrough in one direction only. The airflow-guiding device includes a bracket (42) and a plurality of shielding plates (44). The bracket is secured in the chassis and defines a plurality of guideways (428) therein. The shielding plates are pivotably secured in the guideways with shafts (442) thereof, respectively. The shaft of each of the shielding plates separates the corresponding plate into two portions. One of the two portions is larger and weightier than the other of the two portions.

13 Claims, 6 Drawing Sheets

AIRFLOW-GUIDING DEVICE

BACKGROUND

1. Technical Field

The present invention relates to airflow-guiding devices, and more particularly to an airflow-guiding device used in an electronic device, such as a server.

2. General Background

In a conventional server, a plurality of fans is arranged in a line in a chassis, effectively dividing space inside the chassis into a first space and a second space. When the fans are at work, air flows from the first space to the second space of the chassis, so that heat generated by components in the chassis is taken away from those components. However, when one or more of the fans is not in use, air often flows back from the second space to the first space of the chassis via the one or more fans defeating the purpose of the fans.

What is needed, therefore, is an airflow-guiding device which is capable of preventing air flowing back into a space of a server through unused fans.

SUMMARY

An airflow-guiding device is secured at one side of fans in a computer chassis and is capable of allowing airflow backing in one direction only. The airflow-guiding device includes a bracket and a plurality of shielding plates. The bracket is secured in the chassis and defines a plurality of guideways therein. The shielding plates are pivotably secured in the corresponding guideways with shafts thereof. The shaft of each of the shielding plates separates the corresponding plate into two portions, one of the two portions being larger and weightier than the other of the two portions.

Other advantages and novel features will be drawn from the following detailed description of preferred embodiments with attached drawings, in which:

DETAILED DESCRIPTION OF PREFERRED EMBODIMENTS

Figure 1:
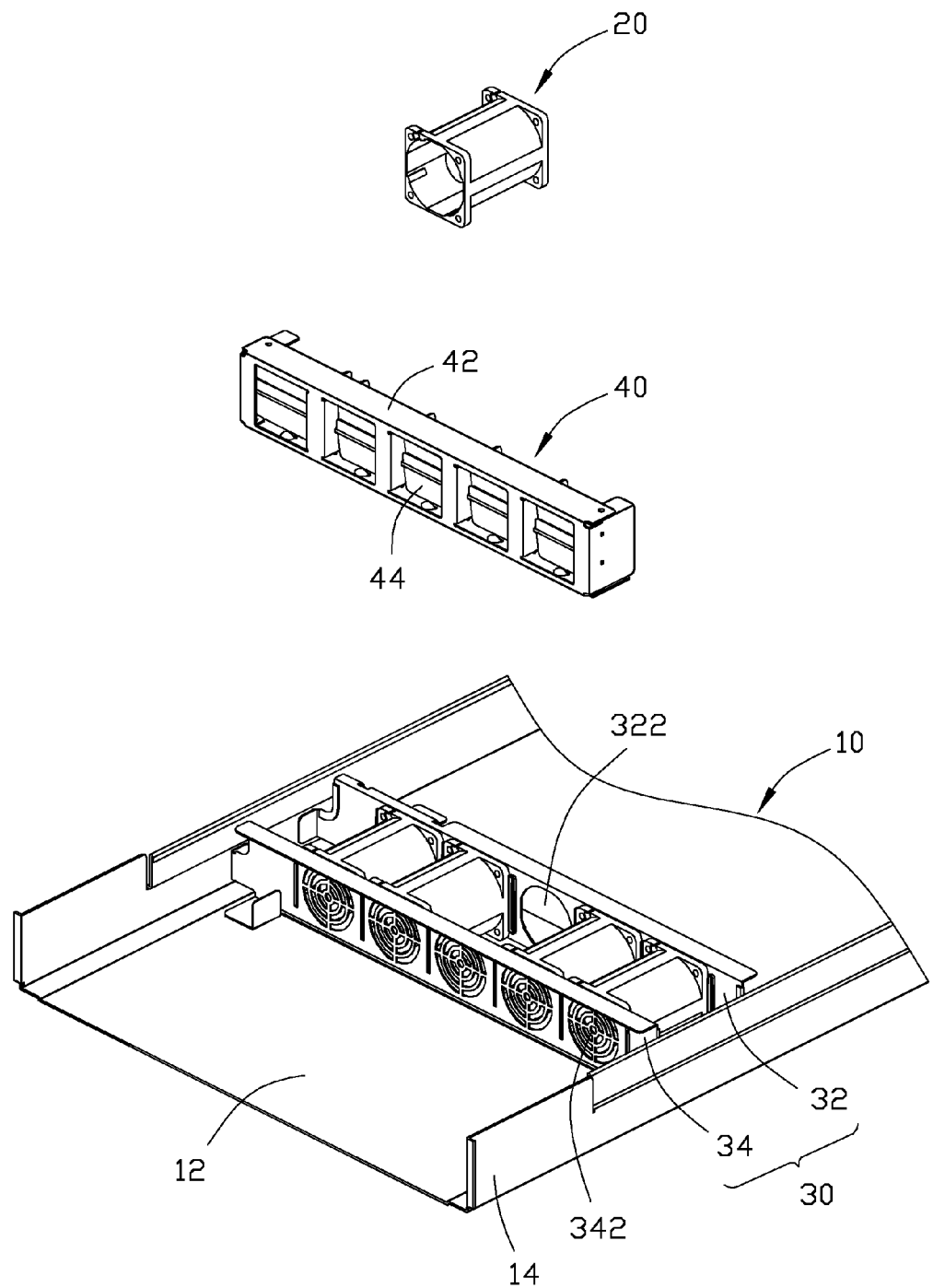
FIG. 1 is an exploded, isometric view of a chassis with a mounting apparatus, a plurality of fans, and an airflow-guiding device in accordance with a preferred embodiment of the present invention, the airflow-guiding device including a bracket and a plurality of shielding plates.

Referring to FIG. 1, a computer chassis 10 includes a bottom plate 12, and a pair of parallel side plates 14 perpendicularly bent from opposite side edges of the bottom plate 12. A mounting apparatus 30 is secured on the bottom plate 12 between the side plates 14 for receiving a plurality of fans 20, and thus dividing space inside the chassis into a front space and a rear space (not labeled). The mounting apparatus 30 includes two parallel mounting plates 32, 34, which are perpendicular to the bottom plate 12 and the side plates 14 of the chassis 10. Each of the mounting plates 32, 34 defines a plurality of ventilation holes 322, 342 therein.

Figure 2:
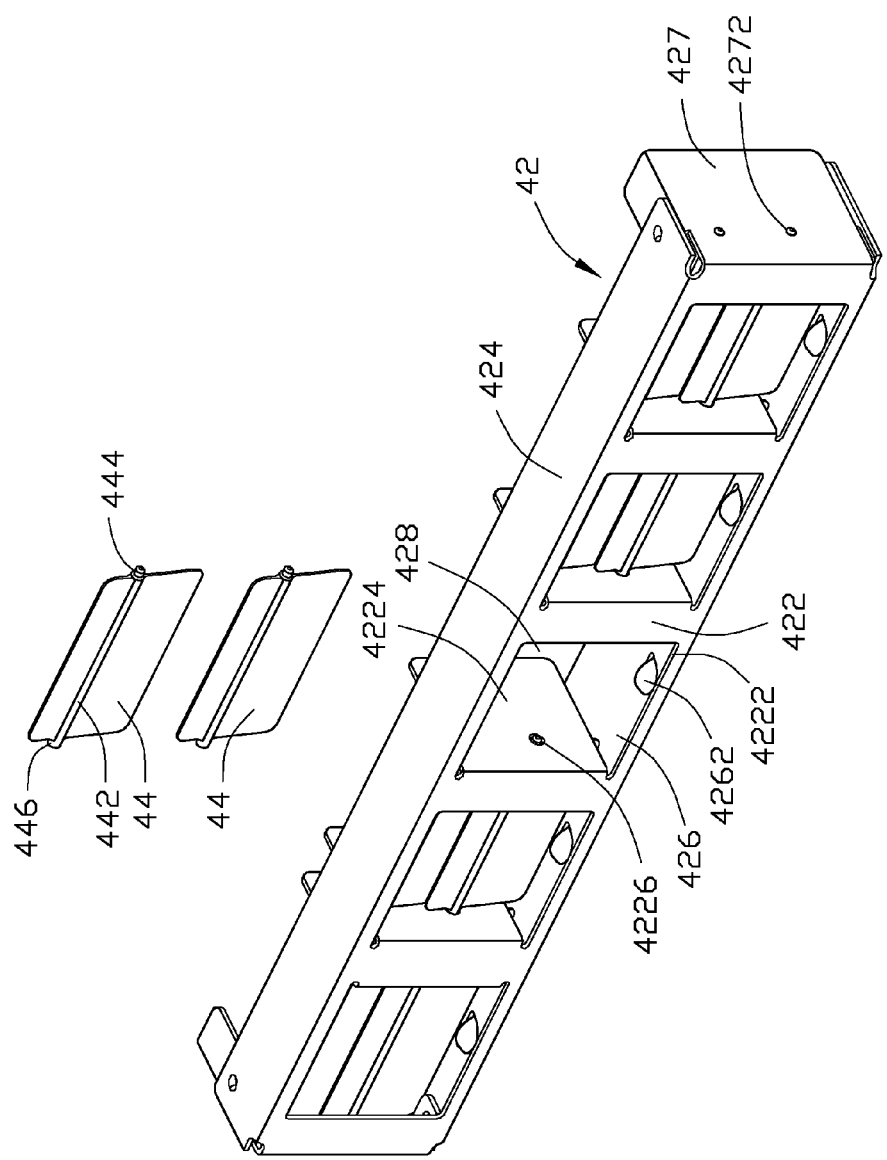
FIG. 2 is another isometric view of the airflow-guiding device of FIG. 1.

Referring to FIG. 2, an airflow-guiding device 40 includes a bracket 42 and a plurality of rectangular shielding plates 44. The bracket 42 includes a front wall 422, a top wall 424, a bottom wall 426, and a pair of parallel side walls 427. The top wall 424, the bottom wall 426, and the side walls 427 are perpendicularly bent from adjacent edges of the front wall 422 in a same direction, respectively. The top wall 424 is parallel to the bottom wall 426, and perpendicular to the side walls 427. The front wall 422 defines a plurality of rectangular openings 4222 therein. An internal wall 4224 parallel to the side walls 427 is perpendicularly bent from an edge of each opening 4222. A plurality of guideways 428 respectively corresponding to the openings 4222 is formed by the internal walls 4224 partitioning space among the front wall 422, the top wall 424, the bottom wall 426 and the side walls 427. Each of the internal walls 4224 and each of the side walls 427 respectively define two pivot holes 4226, 4272 therein, which are arranged in a direction perpendicular to the bottom wall 426. The bottom wall 426 forms a plurality of protrusions 4262 in the guideways 428.

Figure 3:
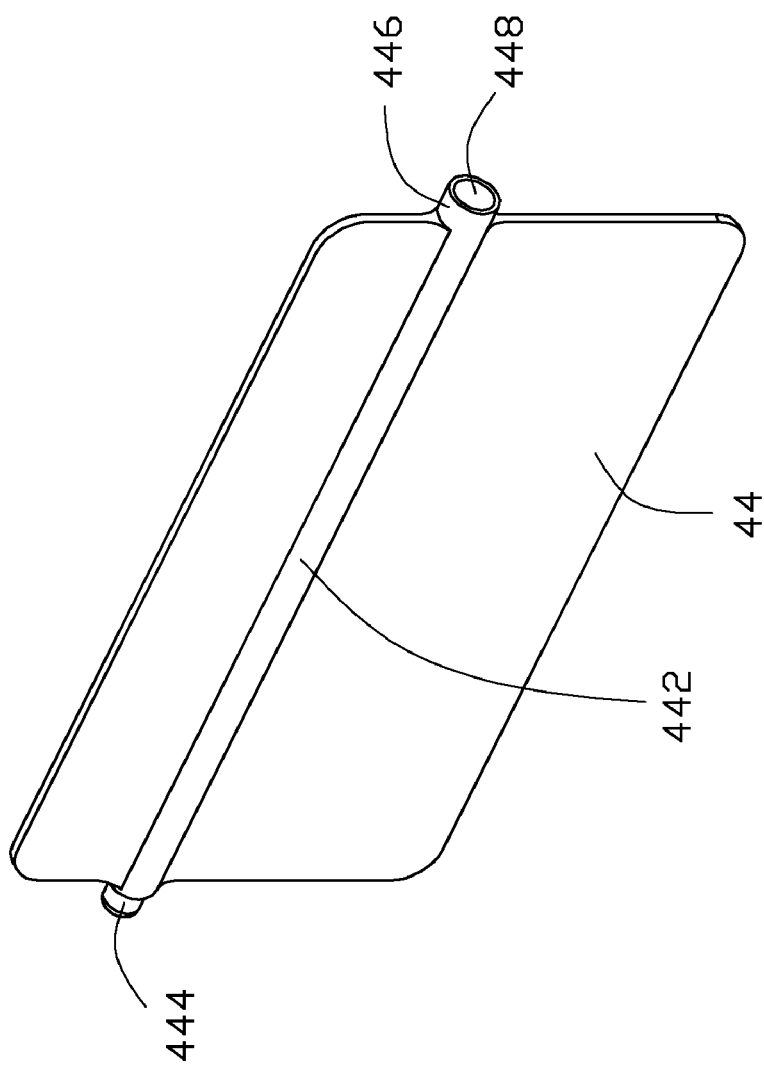
FIG. 3 is another isometric view of one of the shielding plates of FIG. 1.

Referring to FIG. 3, each shielding plate 44 has a shaft 442 for being received in the corresponding pivot holes 4226, 4272 of the internal walls 4224 and the side walls 427. Each of the shielding plates 44 is separated into a top portion and a bottom portion by the corresponding shaft 442. Size of each of the top portions is less than that of the bottom portions. The shaft 442 has two end portions 444, 446 extending out of the shielding plate 44. The end portion 446 defines a slot 448 therein, for receiving the end portion 444 of neighboring one of the shielding plates 44.

Figure 4:
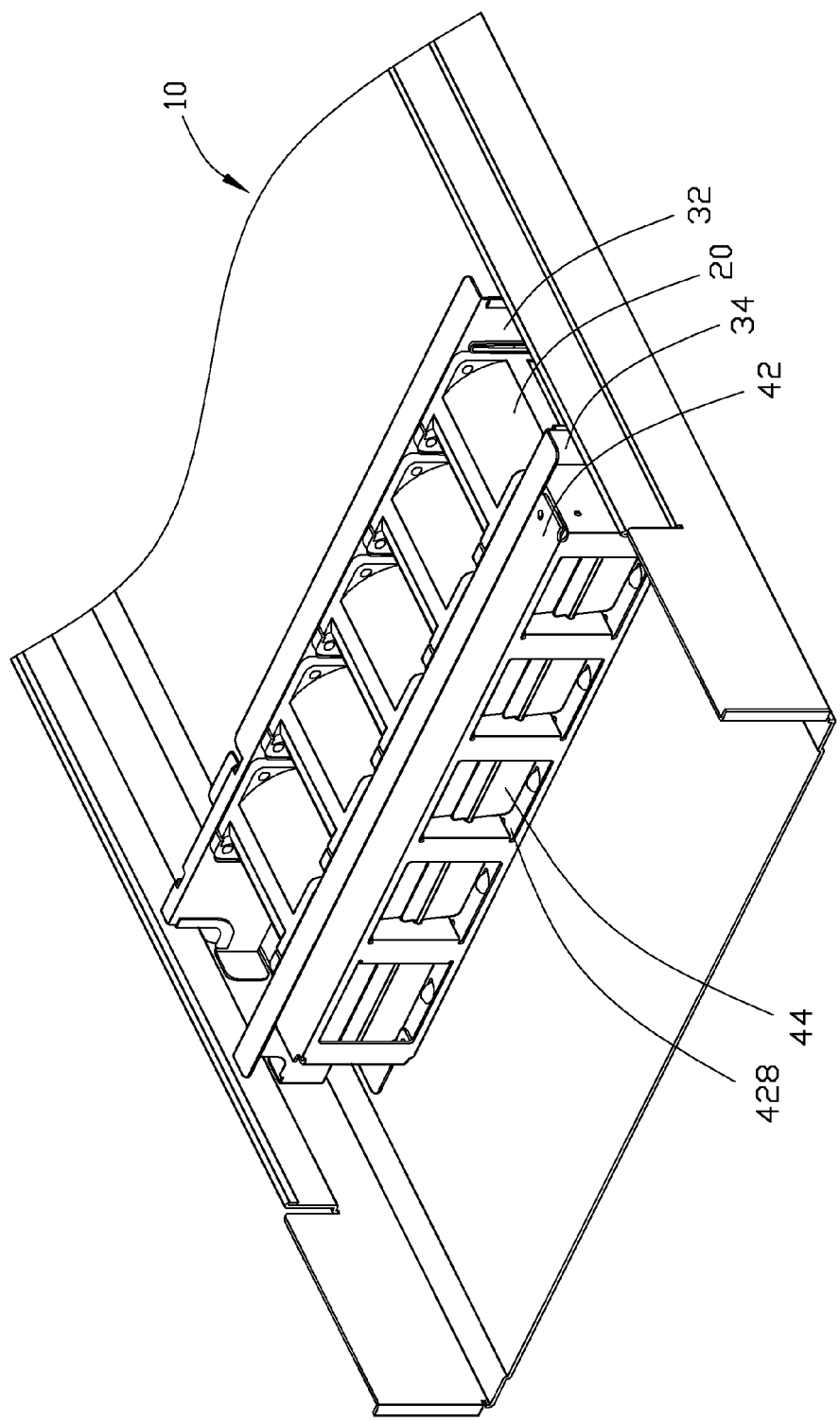
FIG. 4 is an assembled view of FIG. 1.

Referring also to FIG. 4, two of the shielding plates 44 are pivotably secured in each guideway 428, with the end portions 444, 446 thereof respectively being received in the corresponding pivot holes 4226 or the pivot holes 4272. The slot 448 of the end portion 446 of the shaft 442 of one shielding plate 44 in one guideway 428 receives the end portion 444 of the shaft 442 of a corresponding neighboring shielding plate 44 in another adjacent guideway 428. The airflow-guiding device 40 is mounted on the bottom plate 12 of the chassis 10 in the front space. The top wall 424, the bottom wall 426, and the side walls 427 respectively connect with the mounting plate 34. The guideways 428 align with the ventilation holes 322, 342 of the mounting apparatus 30, respectively. The fans 20 are mounted between the mounting plates 32, 34, respectively corresponding to the ventilation holes 322, 342.

Figure 5:
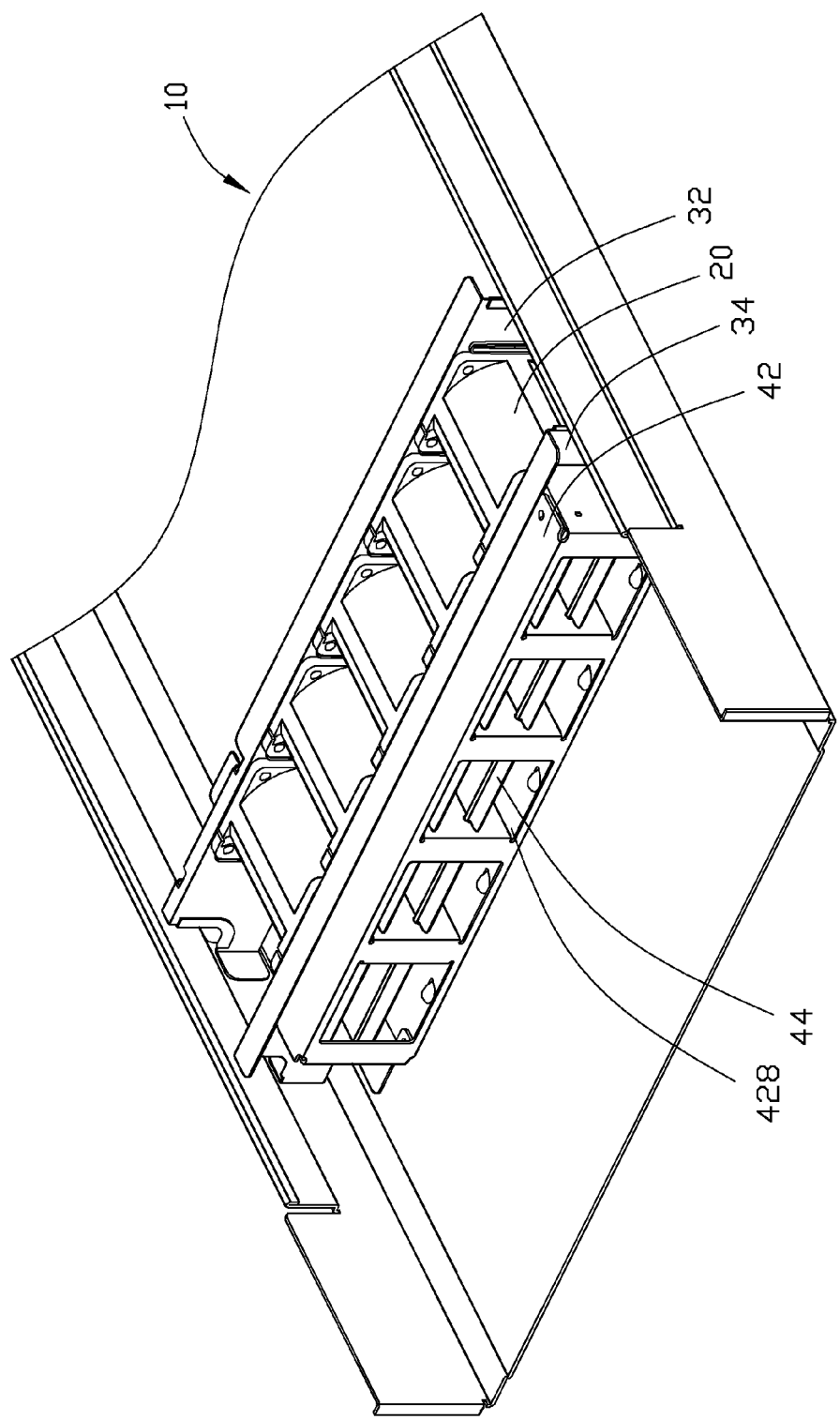
FIG. 5 is similar to FIG. 4, but showing the fans operating.
Figure 6:
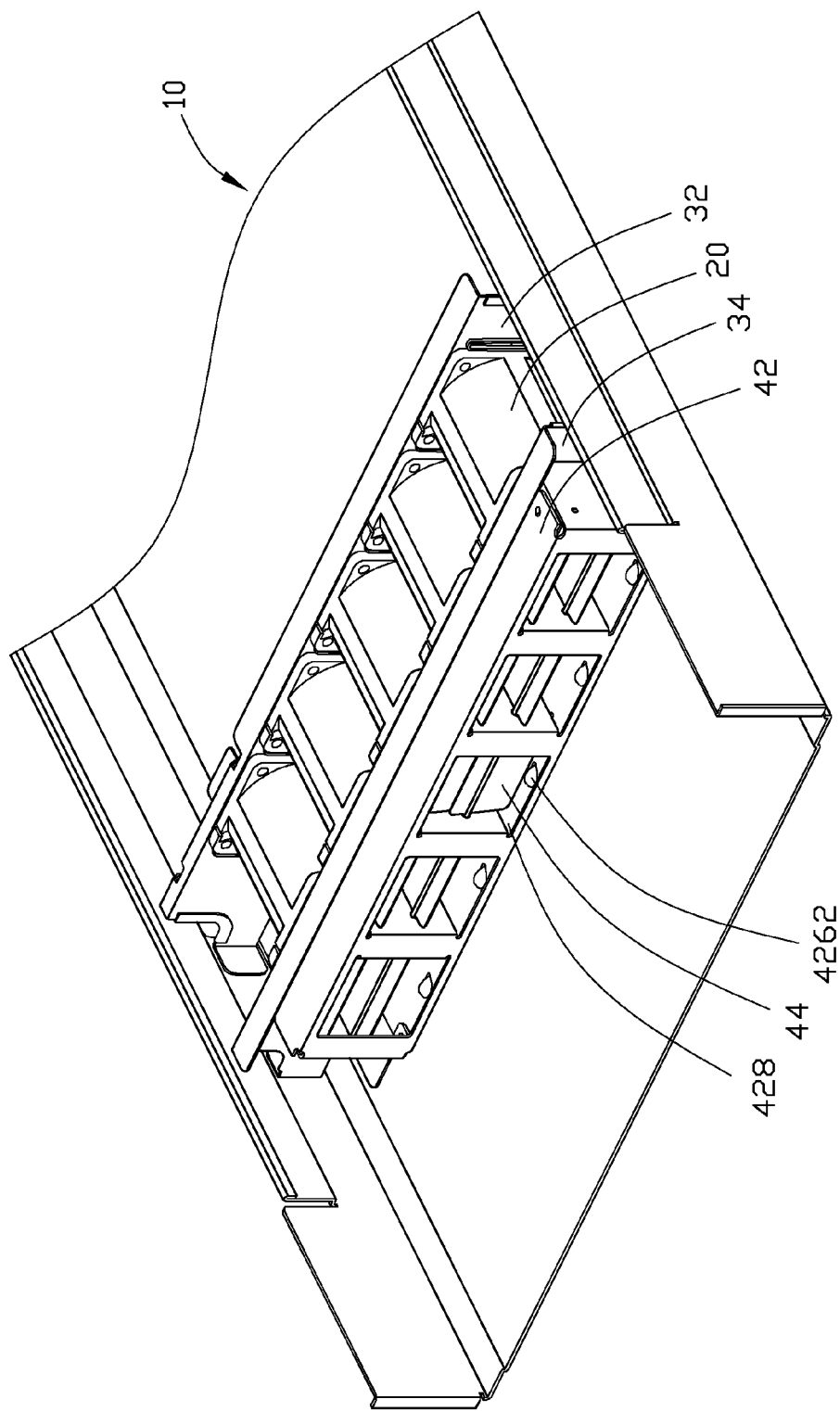
FIG. 6 is similar to FIG. 4, but showing one of the fans not operating while the others are used.

Referring to FIG. 4, before the fans 20 are at work, because the size of the bottom portion of each shielding plate 44 is greater than that of the top portion thereof, and has greater mass, each shielding plate 44 naturally pivots to a closed position under gravity. Referring also to FIG. 5, in use, when all of the fans 60 are at work, air flows from the front space to the rear space of the chassis 10. The shielding plates 44 are pushed by the airflow so that the shielding plates 44 pivot to an open position in a first direction. Referring also to FIG. 6, when one of the fans 60 is not operating, the corresponding shielding plates 44 remain in, or return to, the closed position so that no air may flow back into the front space from the rear space.

In this embodiment, the protrusion 4262 of the bottom wall 426 is used to engage with the bottom portion of one of the corresponding shielding plate 44 to limit the corresponding shielding plates 44 rotating in a second direction reverse to the first direction and maintain the corresponding shielding plates 44 in the closed position.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An airflow-guiding device secured at one side of a row of fans in a computer chassis being capable of allowing airflow generated by the fans to flow in one direction only, comprising:
    a bracket secured in the chassis and defining a plurality of guideways therein; and
    a plurality of shielding plates pivotably secured in the corresponding guideways with shafts thereof, the shaft of each of the shielding plates separating the corresponding plate into two portions, one of the two portions being Larger and weightier than the other one of the two portions;
    wherein each of the shielding plates has two end portions extending out therefrom to act as the shaft, one of the two end portions defining a slot therein, which is capable of receiving the other one of the two end portions of a neighboring shielding plate secured in a neighboring guideway.

2. The airflow-guiding device as described in claim 1, wherein the bracket comprises a front wall, a top wall perpendicular to the front wall, and a bottom wall parallel to the top wall, the front wail defining a plurality of openings therein, an internal wall being bent perpendicularly from an edge of each opening, each of the guideways being formed between adjacent internal walls, and the top and bottom walls.

3. The airflow-guiding device as described in claim 2, wherein each of the internal walls defines at least one pivot hole, for receiving the one of the end portions of a corresponding shielding plate or neighboring two end portions of two corresponding adjacent shielding plates.

4. The airflow-guiding device as described in claim 2, wherein a protrusion is formed on the bottom wall in each of the guideways, for limiting range of rotation of the corresponding shielding plate to thereby prevent the airflow flowing through the guideway in another direction reverse to the one direction.

5. A computer system comprising:
    a chassis defining a space;
    a mounting apparatus secured in the chassis so as to divide the space inside the chassis into a first space and a second space, the mounting apparatus defining a plurality of ventilation holes communicating the first space with the second space;
    a plurality of fans secured in the mounting apparatus corresponding to the ventilation holes;
    a bracket secured in the chassis in one side of the mounting apparatus, the bracket defining a plurality of openings therein corresponding to the ventilation holes of the mounting apparatus; and
    a plurality of shielding plates pivotably secured on the bracket with shafts, the shaft of each of the shielding plates separating the corresponding plate into two portions, one of the two portions being larger than the other of the two portions;
    wherein each of the shielding plates has two end portions extending out therefrom, one of the two end portion thereof defining a slot therein, which is capable of receiving the other one of the two end portion of another shielding plate.

6. The computer system as described in claim 5, wherein the bracket comprises a front wall, a top wall perpendicular to the front wall, and a bottom wail parallel to the top wall, the front wall defining a plurality of openings therein, an internal wall being bent perpendicularly from an edge of each opening, each of the guideways being formed between adjacent internal walls, and the top and bottom walls.

7. The computer system as described in claim 6, wherein each of the internal walls defines at least one pivot hole, for receiving end portion of one shielding plate or one end portion of each of two adjacent shielding plates.

8. The computer system as described in claim 6, wherein a protrusion is formed on the bottom wail at each of the guideways, for limiting range of rotation of the corresponding shielding plate.

9. A computer system comprising:
    a chassis defining a space;
    a mounting apparatus secured in the chassis so as to divide the space into a first space and a second space, the mounting apparatus defining a plurality of ventilation holes communicating the first space with the second space;
    a plurality of fans secured in the mounting apparatus corresponding to the ventilation holes respectively and configured for generating airflow flawing from the first space to the second space;
    a bracket secured in the chassis in one side of the mounting apparatus, the bracket defining a plurality of openings connected to the ventilation holes of the mounting apparatus respectively; and
    at least one shielding plate corresponding to each opening secured on the bracket, the at least one shielding plate being pivotable about an axis in one direction from a closed position where the at least one shielding plate covers the corresponding opening to cut off communication between the first space and the second space to an opening position where the at least one shielding plate uncovers the corresponding opening to thereby allow the airflow flowing from the first space to the second space;
    wherein the at least one shielding plate comprises two end portions protruding from opposite sides thereof along the axis, one of the end portion of the at least one shielding plate corresponding to one of the opening defines a slot configured for receiving the other of the end portions of the at least one shielding plate corresponding top neighboring one of the openings.

10. The computer system as described in claim 9, wherein the bracket further comprises a block member corresponding to each opening configured for blocking the at least one shielding plate from pivoting from the closed position to the opening position in another direction reverse to the one direction.

11. The computer system as described in claim 9, wherein the axis of the at least one shielding plate extends through and divides the at least one shielding plate into two parts having different weight thereby maintaining the at least one shielding plate at the closed position when no airflow flows through the corresponding opening from the first space to the second space.

12. The computer system as described in claim 11, wherein the two parts have different size such that the airflow flowing Through the corresponding opening from the first space to the second space is capable of driving the shielding plate to pivot from the closed position to the opening position in the one direction.

13. The computer system as described in claim 10, wherein the bracket comprises a pair of walls extending from opposite sides of each opening to form a channel connected to the corresponding ventilation hole of the mounting apparatus, each of the walls defines a pivot hole for receiving the corresponding end portion of the at least one shielding plate.

\* \* \* \* \*